United States Patent
Oh et al.

(10) Patent No.: US 9,804,856 B2
(45) Date of Patent: Oct. 31, 2017

(54) SYSTEMS AND METHODS INVOLVING CONTROL-I/O BUFFER ENABLE CIRCUITS AND/OR FEATURES OF SAVING POWER IN STANDBY MODE

(71) Applicant: GSI TECHNOLOGY, INC., Sunnyvale, CA (US)

(72) Inventors: Young-Nam Oh, San Jose, CA (US); Soon Kyu Park, San Jose, CA (US); Jae Hyeong Kim, San Ramon, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 14/996,870

(22) Filed: Jan. 15, 2016

(65) Prior Publication Data

US 2016/0132339 A1   May 12, 2016

Related U.S. Application Data

(62) Division of application No. 13/421,812, filed on Mar. 15, 2012, now Pat. No. 9,240,229.

(51) Int. Cl.
| | |
|---|---|
| *G06F 9/44* | (2006.01) |
| *G11C 7/22* | (2006.01) |
| *G11C 5/14* | (2006.01) |
| *G11C 11/4074* | (2006.01) |
| *G11C 11/4076* | (2006.01) |
| *G11C 11/4097* | (2006.01) |
| *G06F 1/10* | (2006.01) |
| *G06F 1/26* | (2006.01) |

(52) U.S. Cl.
CPC .............. *G06F 9/4403* (2013.01); *G06F 1/10* (2013.01); *G06F 1/26* (2013.01); *G11C 5/148* (2013.01); *G11C 7/22* (2013.01); *G11C 7/222* (2013.01); *G11C 11/4074* (2013.01); *G11C 11/4076* (2013.01); *G11C 11/4097* (2013.01); *G11C 2207/2227* (2013.01)

(58) Field of Classification Search
CPC ....... G11C 11/413; G11C 7/1051; G11C 7/22; G11C 5/147; G11C 5/14; G11C 5/141
USPC ..... 365/233.1, 233.15, 189.2, 226, 227, 229
See application file for complete search history.

(56) References Cited

U.S. PATENT DOCUMENTS

| | | |
|---|---|---|
| 5,587,672 A | 12/1996 | Ranganathan et al. |
| 5,805,912 A | 9/1998 | Johnson et al. |
| 5,883,853 A | 3/1999 | Zheng et al. |
| 6,058,063 A | 5/2000 | Jang |
| 6,665,222 B2 | 12/2003 | Wright et al. |
| 6,789,209 B1 | 9/2004 | Suzuki et al. |
| 6,842,396 B2 | 1/2005 | Kono |
| 7,017,090 B2 | 3/2006 | Endou et al. |
| 7,200,713 B2 | 4/2007 | Cabot et al. |
| 7,487,315 B2 | 2/2009 | Chiang et al. |
| 7,512,033 B2 | 3/2009 | Hur et al. |
| 8,004,920 B2 | 8/2011 | Ito et al. |
| 2004/0062138 A1 | 4/2004 | Partsch et al. |
| 2004/0199803 A1 | 10/2004 | Suzuki et al. |

(Continued)

*Primary Examiner* — Thao H Bui
*Assistant Examiner* — Alfredo Bermudez Lozada
(74) *Attorney, Agent, or Firm* — DLA Piper LLP (US)

(57) ABSTRACT

A method of operating a clock frequency detected control I/O buffer enable circuitry and/or features of saving power. In illustrative implementations, the method may be directed to providing low standby power consumption, such as providing low standby power consumption in high-speed synchronous SRAM and RLDRAM devices.

4 Claims, 11 Drawing Sheets the present invention block diagram of CFD control-i/o buffer enable circuit in a memory circuit

(56) References Cited

U.S. PATENT DOCUMENTS

2009/0154257 A1 6/2009 Fujioka et al.
2010/0169675 A1 7/2010 Kajihara
2011/0299353 A1 12/2011 Ito et al.

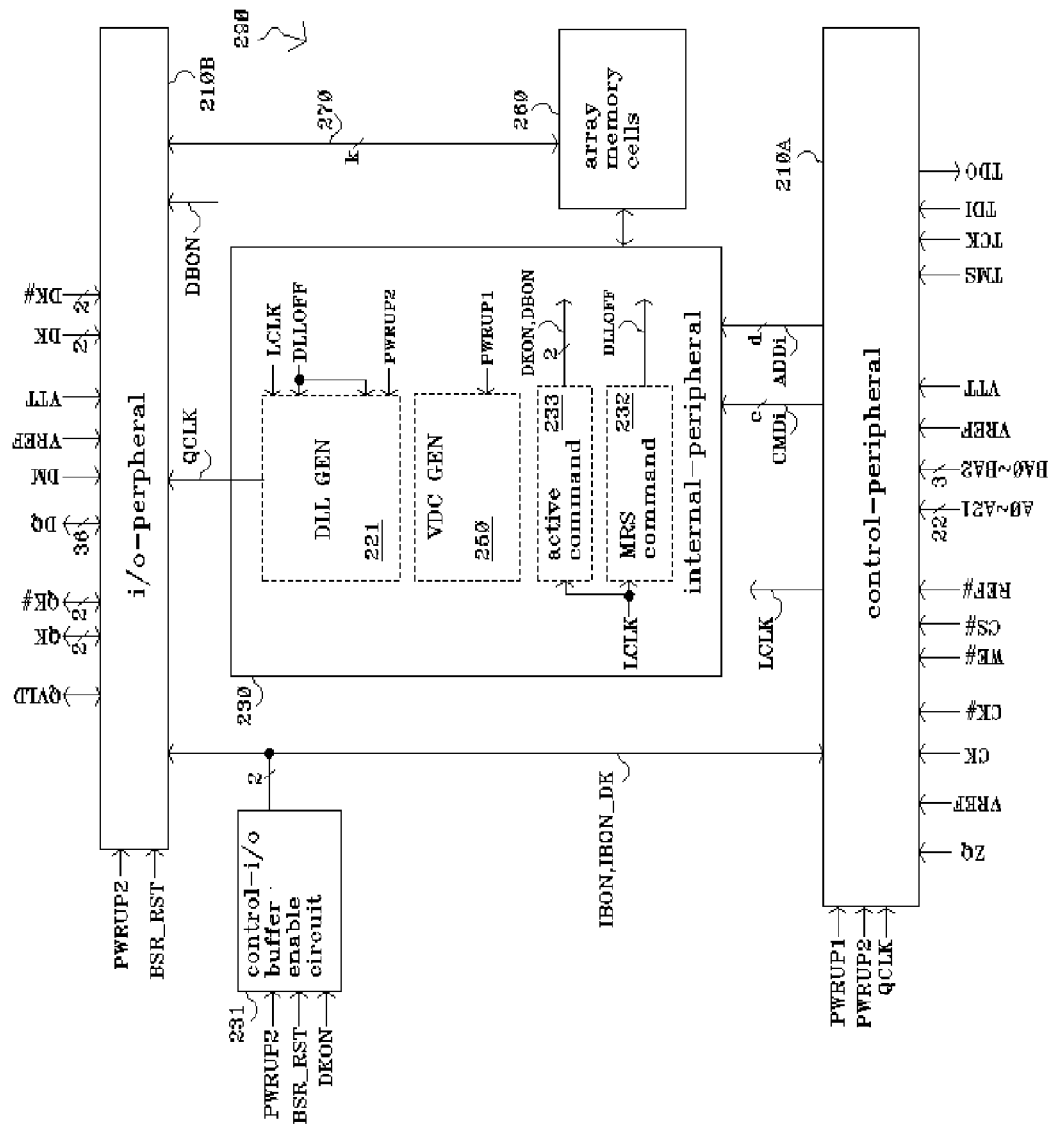
Fig. 1 a prior art block diagram of control- i/o buffer enable circuit in a memory circuit

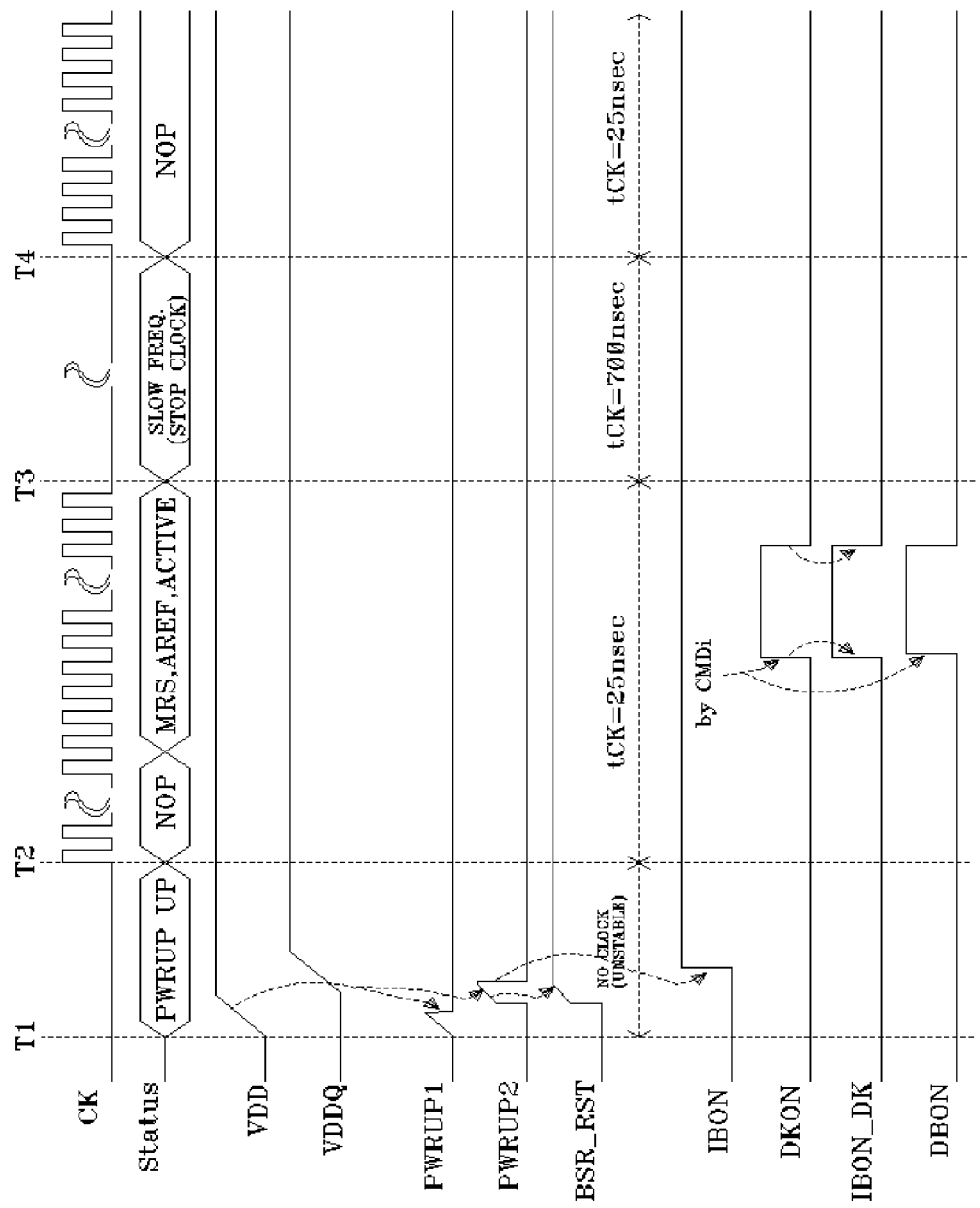
Fig. 2 the timing diagram of the prior control-i/o buffer enable circuit in a memory circuit according to Fig. 1

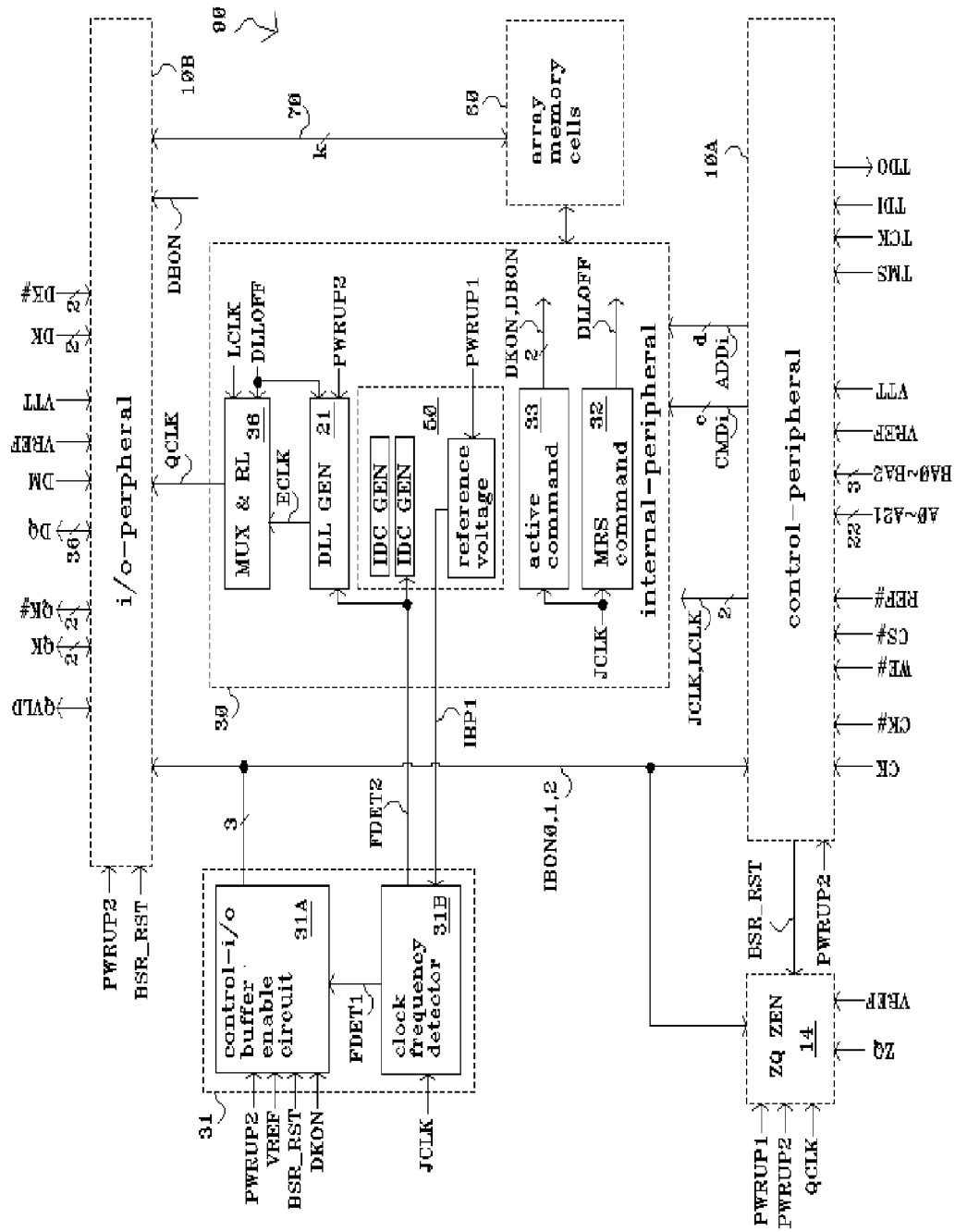
Fig. 3 the present invention block diagram of CFD control-i/o buffer enable circuit in a memory circuit

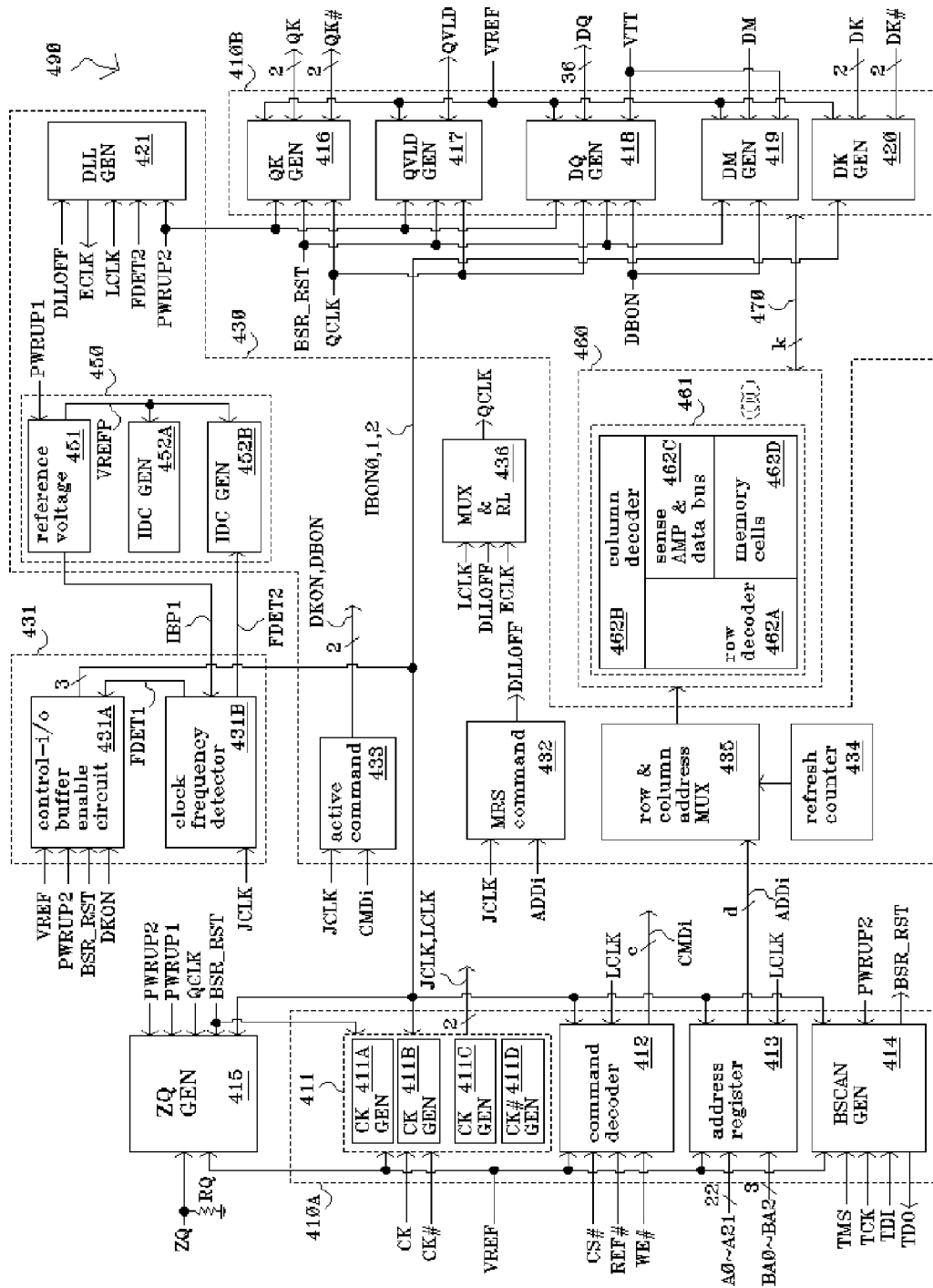
Fig. 4 the present invention of CFD control-i/o buffer enable circuit in a memory circuit

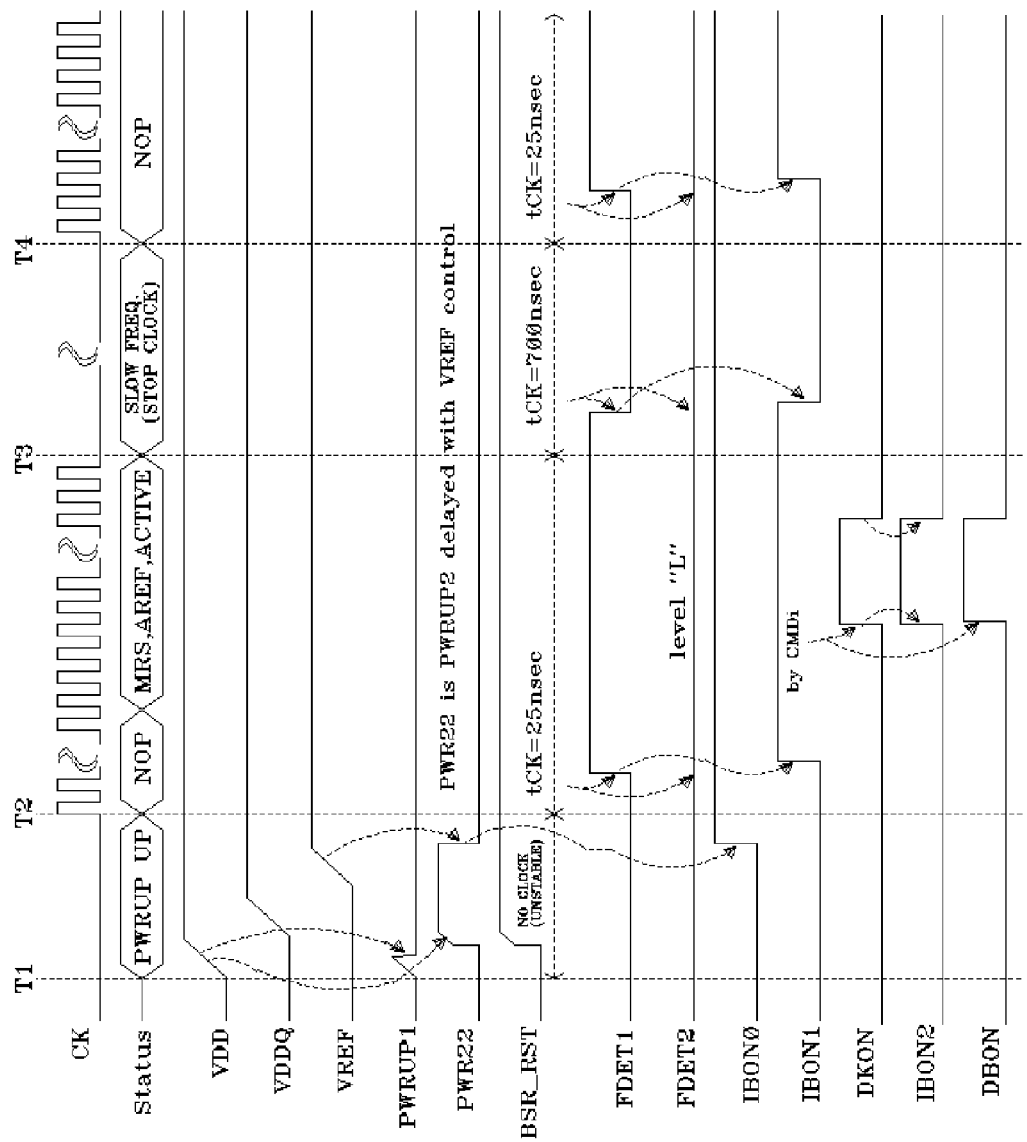
Fig. 5 timing diagram of present invention of CFD control-i/o buffer enable circuit, as per Fig. 4

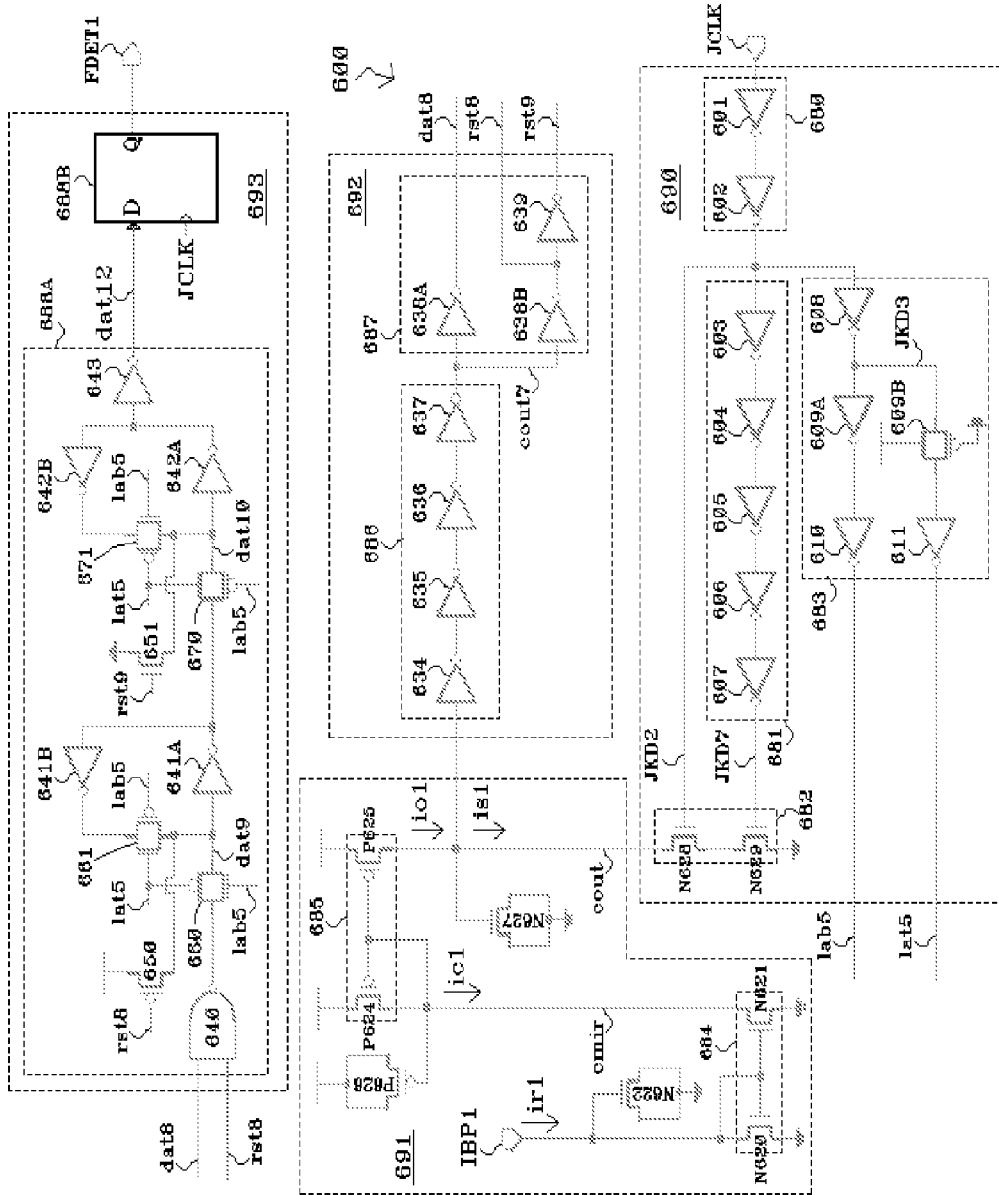
Fig. 6 detailed schematic of the new FDET1 according to Fig. 4

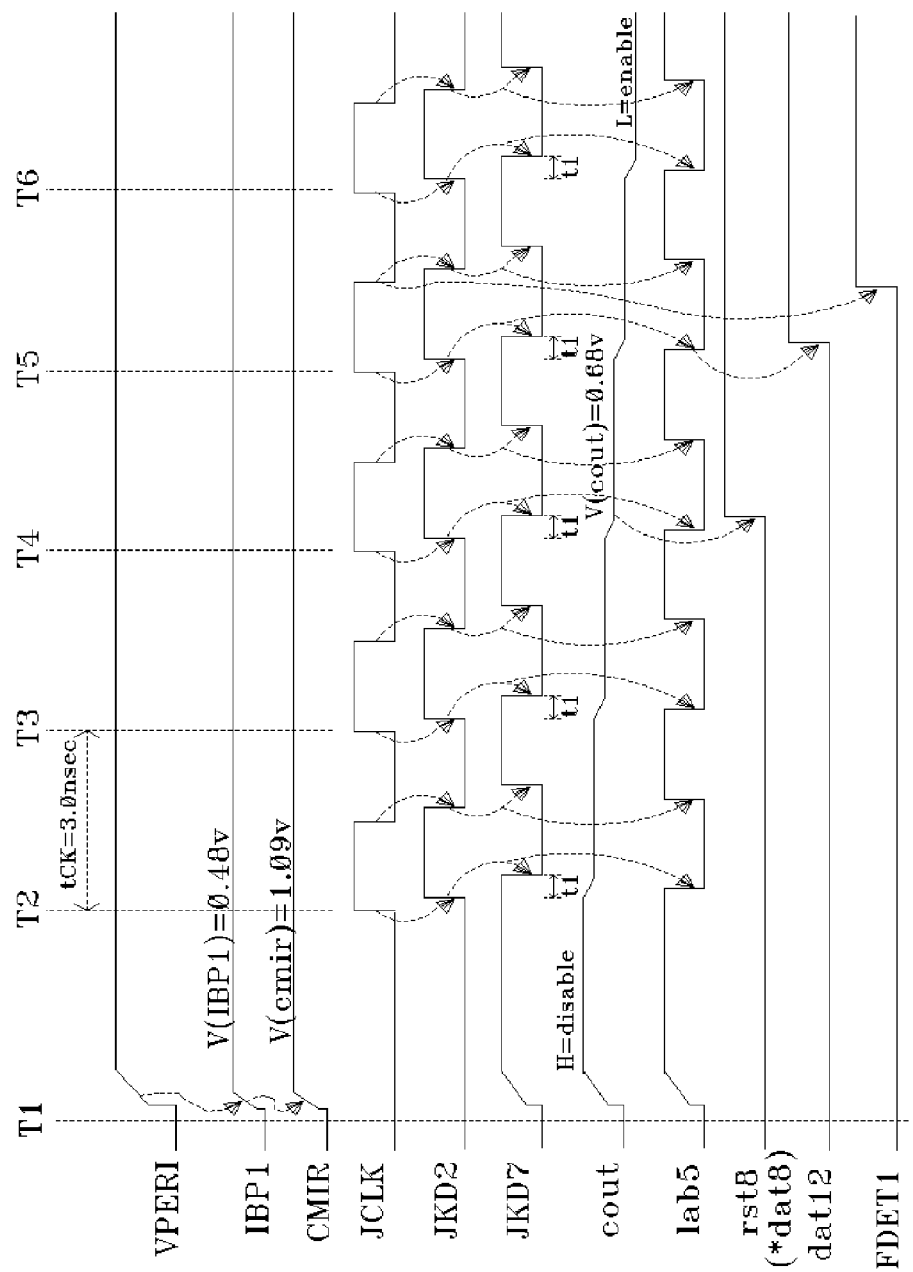
Fig. 7A timing diagram of an enable operation of FDET1 with tCK=3.0nsec according to Fig. 6

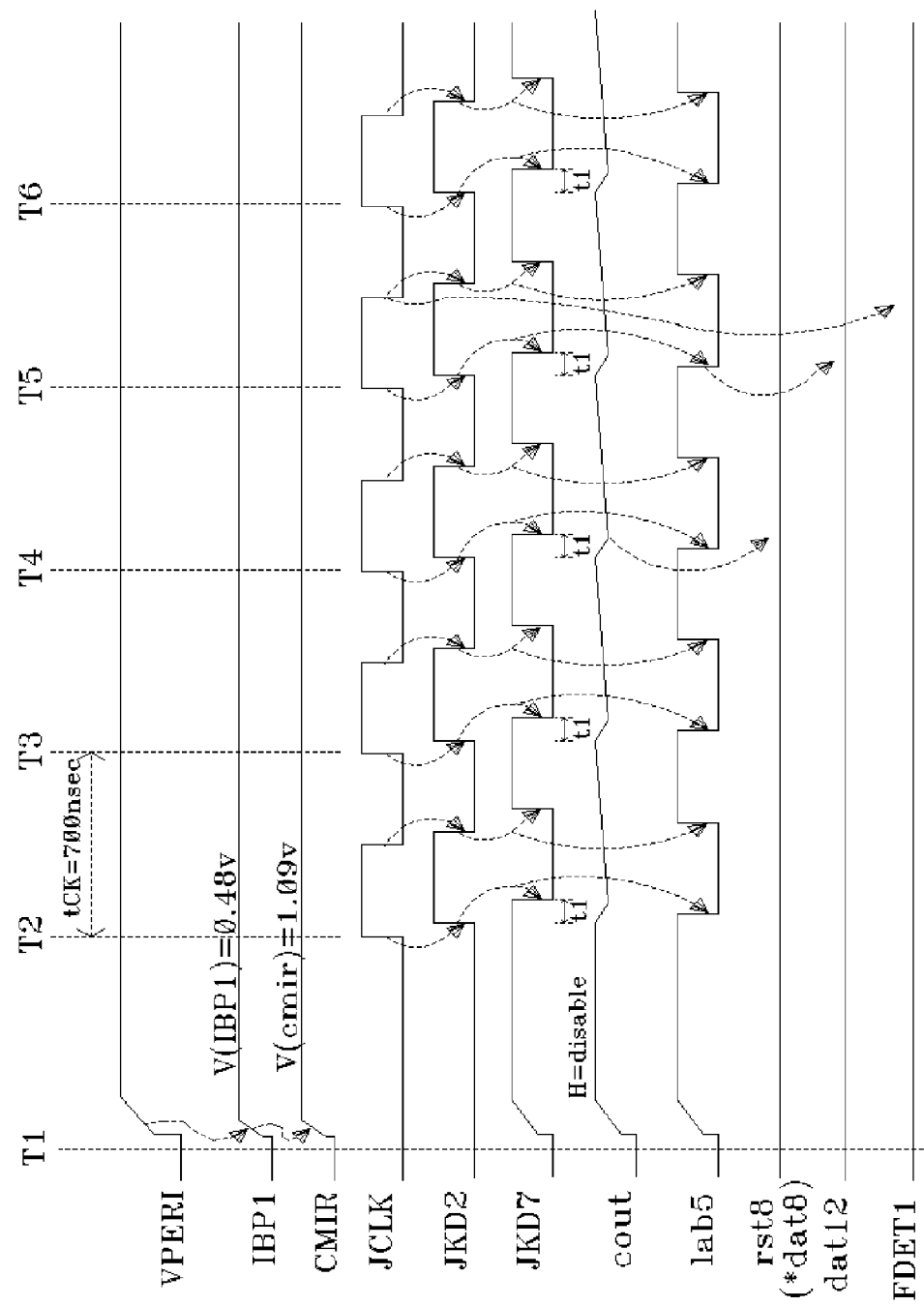
Fig. 7B timing diagram of an disable operation of FDET1 with tCK=700nsec according to Fig. 6

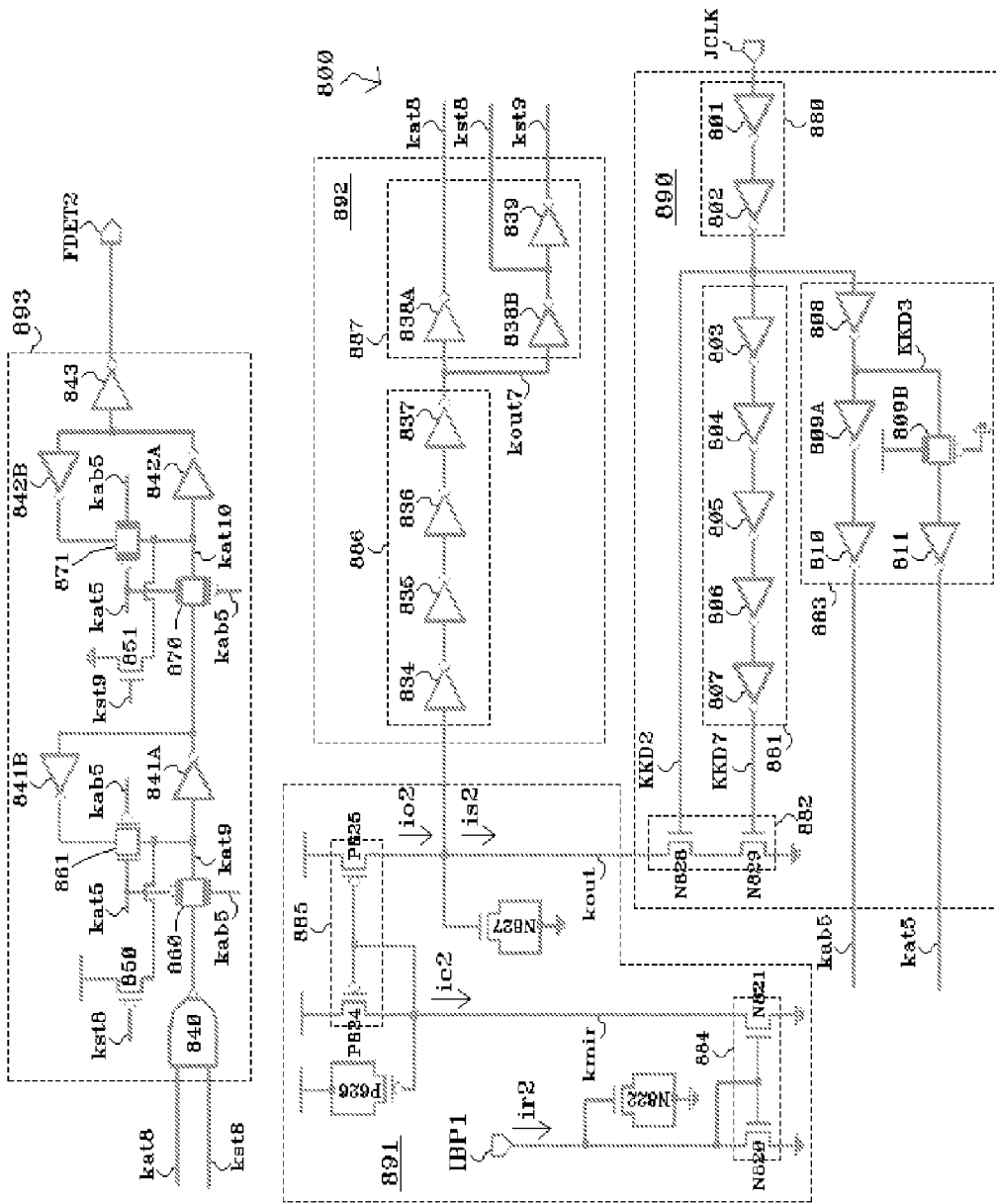
Fig. 8 detail schematic of the new FDET2 according to Fig. 4

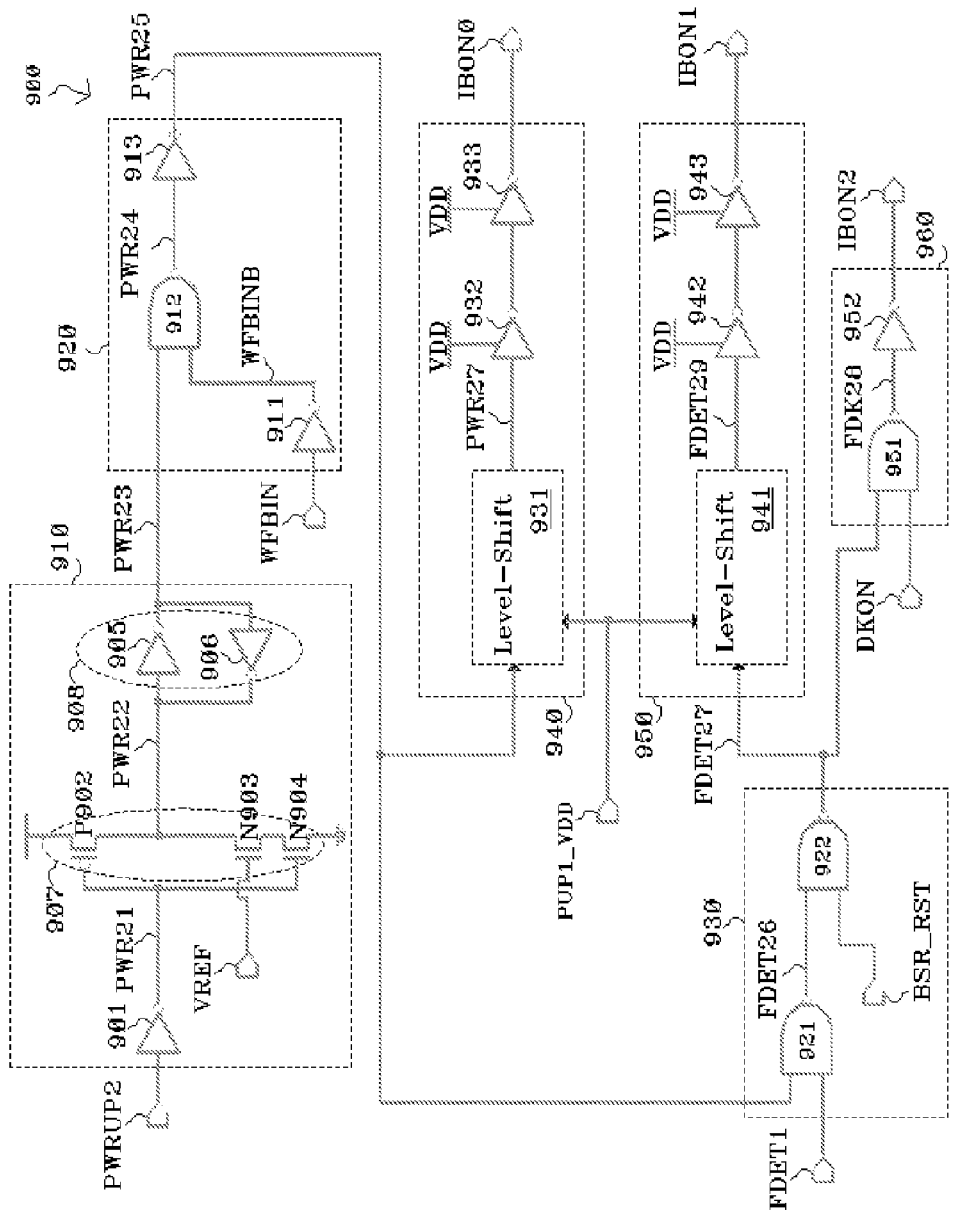
Fig. 9 detail schematic of new control-io buffer enable circuit according to Fig. 4

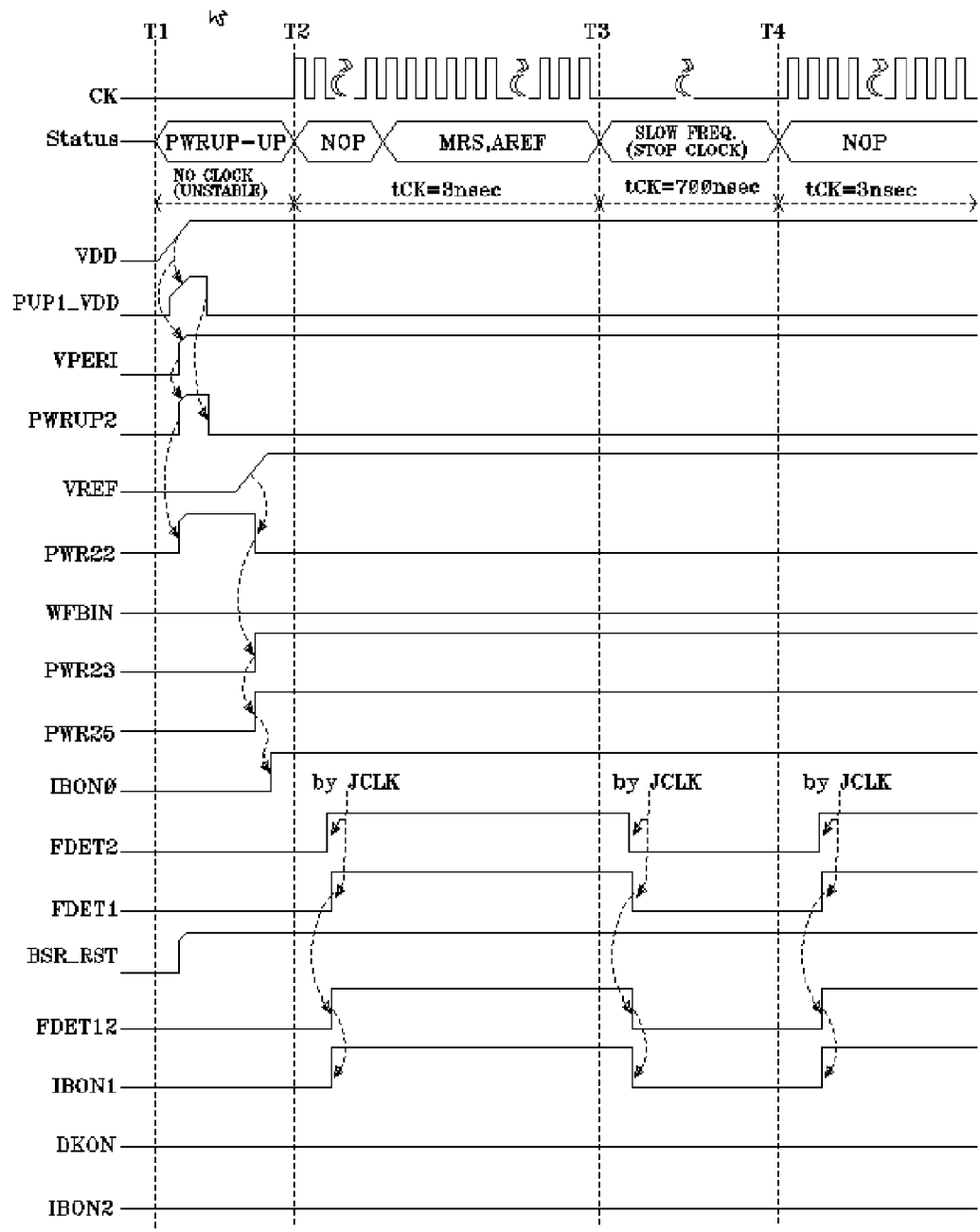
Fig. 10 timing diagram of the new control-io buffer enable circuit as per Fig. 9

SYSTEMS AND METHODS INVOLVING CONTROL-I/O BUFFER ENABLE CIRCUITS AND/OR FEATURES OF SAVING POWER IN STANDBY MODE

PRIORITY CLAIMS/RELATED APPLICATIONS

This application claims priority to under 35 USC 120 and 35 USC 121 and is a divisional of U.S. patent application Ser. No. 13/421,812, filed on Mar. 15, 2012, and entitled "Systems and Methods Involving Control-I/O Buffer Enable Circuits and/or Features of Saving Power in Standby Mode," all of which is incorporated herein by reference.

FIELD

Aspects of the present innovations are directed, generally, to providing low standby power consumption, and, more specifically, to providing low standby power consumption in high-speed synchronous SRAM and RLDRAM devices.

DESCRIPTION OF RELATED INFORMATION

A known memory circuit 290 is set forth in a block schematic diagram shown in FIG. 1. Further, a representative operational timing diagram is illustrated in FIG. 2, showing how the control-i/o buffer enable circuit 231 operates and how the standby power is being consumed, respectively. Referring to FIG. 1, a memory circuit 290 may comprises a control-i/o buffer enable circuit 231, a control-peripheral 210A, an i/o-peripheral 210B, an internal-peripheral 230, and an array of memory cells 260. The internal-peripheral 230 may include circuitry such as an internal VDC 250, a DLL GEN 221, an active command 233, and a MRS command 232, among other components. The signal PWRUP1 is a first power up signal going on upon detection of ramp-up external power supply and configured to initialize control-peripheral 210A and internal VDC 250, while signal PWRUP2 is a second power up signal going on upon detection of ramp up of internal power supply and configured to initialize control-i/o buffer enable circuit 231, control-io-peripheral (210A and 210B), and internal-peripheral 230. Further, the signal BSR_RST may be configured for enabling BSCAN function, and other aspects (e.g. ports, and so forth) may be configured to generate various other internal signals.

In various circumstances in the circuits of FIG. 1, however, the signal IBON is held on the high level-state even though the power up initialization procedures are finished, while at the same time signal DBON is held on the low level-state (enabled only active in write command with the high level-state). Accordingly, such memory circuits will consume unnecessary standby power at group 2, group 4, group 5, group 6, and so forth, as viewed by way of illustration in connection with Table 1 below.

As set forth below, one or more aspects of the present inventions may overcome these or other drawbacks and/or otherwise impart innovative features.

DESCRIPTION OF THE DRAWINGS

The accompanying drawings, which constitute a part of this specification, illustrate various implementations and aspects of the present invention and, together with the description, explain various features of the innovations herein. In the drawings:

FIG. 1 is a block diagram illustrating a known memory device.

FIG. 2 is an representative timing diagram showing operational timing consistent with FIG. 1.

FIG. 3 is a block diagram showing one implementation of illustrative memory circuitry, consistent with one or more aspects related to the innovations herein.

FIG. 4 is a block diagram showing another implementation of illustrative memory circuitry, consistent with one or more aspects related to the innovations herein.

FIG. 5 is a diagram showing illustrative operational timing features such as may be associated with the circuitry of FIG. 4, consistent with one or more aspects related to the innovations herein.

FIG. 6 is a block diagram showing an illustrative clock frequency detector circuitry, consistent with one or more aspects related to the innovations herein.

FIGS. 7A and 7B are diagrams showing illustrative operational timing features such as may be associated with the circuitry of FIG. 6, consistent with one or more aspects related to the innovations herein.

FIG. 8 is a block diagram showing another illustrative clock frequency detector circuitry, consistent with one or more aspects related to the innovations herein.

FIG. 9 is a block diagram showing an illustrative control-i/o buffer enable circuitry, consistent with one or more aspects related to the innovations herein.

FIG. 10 is a diagram showing illustrative operational timing features such as may be associated with the circuitry of FIG. 9, consistent with one or more aspects related to the innovations herein.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present inventions. Wherever possible, the same reference numbers will be used throughout the drawings to refer to the same or like parts.

Aspects of the present innovations are directed to providing low standby power consumption in certain high-speed synchronous RAM devices. For example, systems and methods herein include features that provide low standby power consumption involving detecting clock frequency and controlling the power dissipation parts for the high-speed synchronous SRAM and RLDRAM devices, such as when in slow frequency and/or in stop clock mode(s).

According to some implementations, for example, adaptive CFD control-i/o buffer enable circuits may be provided whether the input system clock frequency is at test range or at idle range. Further, and then some combined this predetermined output signals with internal power up signals or CFD output themselves are coupled to each group respectively so that this new arts of memory circuit can consume reducing standby power depending on the input system clock frequency ranges.

FIG. 3 is a block diagram showing one implementation of illustrative memory circuitry, consistent with one or more aspects related to the innovations herein. Referring to FIG. 3, implementations consistent with the present innovations may include a clock frequency detected (the "CFD") control-i/o buffer enable circuit 31 located in memory circuit 90.

Such circuitry may include CFD control-i/o buffer enable circuit 31, control-peripheral 10A, ZQ GEN 14, i/o-peripheral 10B, internal-peripheral 30, array memory cells 60, among other components. The internal-peripheral component 30 may include internal VDC 50, DLL GEN 21, MUX & RL 36, active command 33, and MRS command 32 included within the CFD control-i/o buffer enable circuit 31, among other components. Here, signal PWRUP1 is a first power up signal going on upon detecting ramp up of the external power supply, which may be configured to initialize the internal DC circuit. Signal PWRUP2 is a second power up signal going on upon detecting ramp up of an internal power supply, and which may be configured to initialize internal-peripheral circuit 30 in memory circuit 90. Further, signal BSR_RST may be configured for enabling BSCAN function, and/or perform additional/differing functions for RLDARM ports and/or some other internal signals. In operation, the CFD control-i/o buffer enable circuit 31 coupled to control-i/o-peripheral (10A and 10B), DLL GEN 21, and internal VDC 50 may, respectively, be configured to initialize memory circuit 90 in accordance with signal PWRUP1, PWRUP2, BSR_RST, and signal IBON0~2 developed by clock frequency range. Additionally, the circuitry may further be configured to continue operation with output DKON coupled to signal IBON0~2 and DBON coupled to i/o-peripheral 10B when it is at active command state-write cycle. Further, the CFD control-i/o buffer enable circuit 31 may be configured to continue operation with DLL GEN 21 outputting signal QCLK and internal VDC 50 generating internal power supply.

In some implementations, memory circuit 90 may be configured to provide an adaptive clock frequency detector 31B in accordance with control-i/o buffer enable circuit 31A, e.g., to minimize its power consumption in case II or case III in Table 2. Such minimization may occur even though input system clock frequency (the "tCK") is out of the RLDRAM operating range (referred to RLDRAM normal range; here, in one illustrative implementation, for example, here tCK may be 1.875 nsec to 5.7 nsec, test range tCK may be 20 nsec to 700 nsec, idle range may be 700 nsec to end) e.g. where the CFD 31B detects case III, and in such frequency range. Here, then, the memory circuitry 90 may enter into a low power mode, like a sleep mode, where various high consumption power blocks can be shut down, with the exception of circuitry such as small CK buffer, TMS buffer, TCK buffer, and some DC internal voltages, as set forth herein. However, when going back into normal range (e.g. at input clock frequency rates), some implementation may utilize some dummy cycles, like a power up 'on' dummy cycle, before being ready for NOP (no operation) state.

Table 1 below summarizes group numbers of this memory circuit 90 controlled by the CFD controlled control-i/o buffer enable circuit 31. Further, as touched on above, these groups as viewed in connection (combined) with Table 1 aspects, help show how power consumption may be reduced during case III. According to some implementations, memory circuitry 90 herein may force some circuitry blocks to be disabled via the proposed CFD controlled control-i/o buffer enable circuit 31 operation, e.g., Table 1 specified groups 2 to 6 may be disabled except for group 1 being back into normal range. Further, during case II standby groups 4 to 6 may be disabled. Moreover, during case I standby group 1 to 5 may be enabled except for group 6 coupled to active mode block.

TABLE 1

Detailed circuitry groups related to device circuitry names

| Group No. | Name<br>Input Buffer base on Port Name or Block Circuit<br>Name |
|---|---|
| 1 | TMS, TCK, small CK |
| 2 | A0~A21, BA0~BA2, CS#, REF#, WE#, large CK |
| 3 | ZQ GEN |
| 4 | internal VDC |
| 5 | DLL GEN |
| 6 | DQ0~DQ35, DM, DK0~DK1, DK#0~DK#1 |

FIG. 4 is a block diagram showing another implementation of illustrative memory circuitry, consistent with one or more aspects related to the innovations herein. Referring to FIG. 4, another illustrative memory circuit 490 is set forth in the block diagram shown, which may also involve the operational timing diagram of FIG. 5. Systems and methods, here, may serve to illustrate how the CFD controlled control-i/o buffer enable circuit 431 operates and how the standby power is being consumed, respectively. Implementations of such memory circuits 490 may comprise CFD controlled control-i/o buffer enable circuit 431, a control-peripheral 410A, a ZQ GEN 415, an i/o-peripheral 410B, an internal-peripheral 430, and an array of memory cells 460, among other components.

Internal-peripheral component 430 may comprise an internal VDC 450, a DLL GEN 421, MUX &RL 436, an active command 433, a MRS command 432, refresh counter 434, and row & column address MUX 435, all included within the CFD control-i/o buffer enable circuit 431 among other components. The memory cell array 460 may include a plurality memory unit 461 with row decoder(s) 462A, column decoder 462B, sense AMP & data bus 462C, and memory array 462D. According to some implementations, signal PWRUP1 may be a first power up signal going on upon detection of ramp up in external power supply, and which may be configured for initializing internal VDC 450. Signal PWRUP2 is a second power up signal going on upon detection of ramp up of internal power supply, and which may be configured for initializing internal-peripheral 430. Signal BSR_RST may be configured for enabling BSCAN function, and other signals (e.g., all ports, and so forth) may be configured for utilization with RLDARM function(s) to generate some internal signals such as LCLK, JCLK, CMDi, ADDi, DKON, DBON, ECLK, QCLK, DLLOFF, IBP1, VREFP as shown in FIG. 4, according to aspects of the present innovations.

Consistent with such implementations, CFD 431 may produce predetermined outputs combined with internal power up signals (or CFD 431 predetermined outputs themselves selectively coupled to the grouped blocks) such that memory circuit 490 may reduce standby power consumption in accordance with an adaptive frequency detector outputs generated from external clock frequency ranges. These and other innovations are explained in the present disclosure and otherwise appreciated from the blocks, connections and signals set forth in the tables and drawings by one of ordinary skill in the art.

TABLE 2

Detailed circuitry groups related to being enabled or disabled, such as also in reference to Table 1

| | Function Range | | | | | |
|---|---|---|---|---|---|---|
| | Case I: normal range | | Case II: test range tCKEsecl | | Case III: idle range | |
| | less than 20n | | 20n to 700n | | more than 700n | |
| Status | standby | active | standby | active | Standby | active |
| Enable Group No. | 1~5 | 1~6 | 1, 2, 3 | 1, 2, 3, 6 | 1 | 1 |
| Disable Group No. | 6 | none | 4, 5, 6 | 4, 5 | 2~6 | 2~6 |

Table 2 summarizes device circuitry groups related to being enabled or disabled, as considered with reference to Table 1. here, for example, when tCK range is at case II-III in Table 2 (see, for reference, T2 to T4 in FIG. 2), the signal IBON is maintained at the high level-state even though the power up initialization procedures are finished, while at the same time signal DBON is maintained in the low level-state (enabled only active in write command with the high level-state).

Turning back to various components and implementations of FIG. 4, control-peripheral component 410A of the CK GEN 411 may be configured to receive external clock port signals (CK and CK#) and may include four kinds of input buffers. For example, a first input buffer 411A may include circuitry directed to or be dedicated to a small CK buffer function, e.g., being turned on persistently after power up initialization to produce signal JCLK coupled to clock frequency detector 431B, MRS command 432, and active command 433 in order to detect next following tCK frequency. Further, the first input buffer 411A may also be configured to provide stable operation, such as via keeping various signals in stable NOP state, like T1 to T2 in FIG. 5. A second input buffer 411B may include circuitry directed to or be dedicated to a large CK buffer function, e.g., be configured to turn off according to the level of signal FDET1 of the first output of CFD circuit 431B and generate signal LCLK coupled to command decoder 412, address register 413, MUX & RL 436, and DLL GEN 421. A third input buffer 411C may include circuitry directed to or be dedicated to CK input buffer for JTAG function, and a fourth input buffer 411D may include circuitry directed to or be dedicated to CK# input buffer for JTAG function. System 490 may include a command decoder component 412 configured to receive control port signals (CS#, REF#, and WE#), and which may provide device commands during normal range, and also maintain off states during the specified idle range. An address register component 413 may be configured to receive address port signals (A0~A21 and BA0~BA2), that provide device external addresses during normal range, and also maintain off states during the specified idle range. Additionally, a BSCAN GEN component 414 may be included and may be configured to provide JTAG function base on 4 ports combination (TMS, TCK, TDI, and TDO), as may be controlled by signal PWRUP2 and signal BSR_RST, and may maintain an off state in normal range unless invoking JTAG function mode. Further, the BSCAN GEN component 414 may also be configured with a supporting BSCAN function enable mode via allowing TMS and TCK input buffers to maintain on states during idle mode. Lastly, a ZQ GEN component 415 may be configured to receive a ZQ port signal. Here, e.g., via a resister from ZQ to ground, device calibrating DQ output impedance information may be provided during normal range, and the ZQ GEN component 415 may also maintain an off state during the specified idle range.

Certain implementations may also include an internal-peripheral component 430 of the internal VDC component 450 which may include a reference voltage 451, and IDC GEN circuitry (452A and 452B). Here, for example, the internal-peripheral component 430 may include circuitry configured with a first signal IBP1 of reference voltage 451 adapted to provide a first reference voltage for CFD 431B, and with a second signal, VREFP, adapted to provide second reference voltage for IDC GEN (452A and 452B). In some implementations, the internal-peripheral component may include two different driver types IDC GEN1 452A and IDC GEN2 452B. Here, for example, IDC GEN1 452A may be configured such that it is not controlled by signal FDET1, which means the respective memory circuit 490 needs at least small IDC GEN 452A power supply to be turned on to maintain case III state. Further, the IDC GEN 452B may be turned off depending on the signal FDET2 state, e.g., whether it is at normal range or at idle range. The MRS command component 432, which may be based on external command, may be configured to produce signal DLLOFF in accordance with first command signal such as first combination (signal JCLK, CMDi, and ADDi). MRS command component may be configured to control DLL GEN 421 and MUX & RL 436. Systems and methods may also include or involve an active command component 433, which may also be based on external command, to produce signals DKON and DBON in accordance with second command signal such as second combination (signal JCLK and CMDi). Further, here, such circuitry/signal may configured for controlling control-i/o buffer enable circuit 431A, DQ GEN 418, DM GEN 419, respectively.

Additionally, implementations such as that of FIG. 4 may also include a row & column address MUX component 435, which may be configured to receive refresh counter 434 outputs and/or active command 433 outputs, and which may be configured to be based on external command(s). Further the row & column address MUX component may be coupled to an array of memory cells 460 in communication with a k-bit global-bus 470. Here, for example, the k-bit global-bus 470 of array memory cells 460 may be coupled to i/o-peripheral 410B and may carry out read data or carry in write data. The array of memory cells 460 may comprise a plural memory unit 461 including row decoder 462A, column decoder 462B, sense amplifier & data bus 462C, and memory cells 462D. A MUX & RL component 436 may also be included for receiving either signal LCLK or signal ECLK selected by signal DLLOFF and shifted by signal RL produces output clock QCLK. Here, for example, the MUX & RL component 436 may drive output buffers such as QVLD GEN 417, QKGEN 416, and/or DQ GEN 418.

System 490 may include a DLL GEN component 421 that receives signal LCLK from command decoder component 412 when a DLL mode is selected at normal range (e.g., via signal DLLOFF from MRS command) and that produces output signal ECLK which may be connected to the MUX & RL component 436. Further, the DLL GEN component 421 may itself be configured to receive one of the CFD output(s) in operating a different frequency range to that of a normal range for saving standby power. Here, the CFD controlled control-i/o buffer enable circuit 431 will describe later in FIG. 6 through FIG. 10.

In some embodiments, the i/o-peripheral component 410B may be comprised of a QK GEN subcomponent 416, a QVLD GEN subcomponent 417, a DQ GEN subcomponent 418, a DM GEN subcomponent 419, and a DK GEN subcomponent 420. Turning to the illustrative implementation of FIG. 4, the QK GEN subcomponent 416 may be configured to transmit output data clocks (QK0~QK1 and QK#0~QK#1) to synchronize output data controlled by the signal QCLK. Further, QK Gen 416 may be configured to turn off during the specified idle mode. The QVLD GEN subcomponent 417 may be adapted to indicate that a valid data window is synchronized with the output data clock controlled by the signal QCLK, and may too be configured to maintain a turn off state during the specified idle mode. The DQ GEN subcomponent 418 may be configured to receive DQ port signals (DQ0~DQ35), e.g. through its own input buffers, and may transmit k-bit data to the global bus 470. Further, DQ GEN 418 may generate device write data according to signal DBON in active mode during normal range, and may too be configured to maintain off states during the specified idle range. The DM GEN subcomponent 419 may be configured to receive input data mask port signal (DM), e.g. through its own input buffer, and to generate device write mask data according to signal DBON in active mode during normal range, and may too be configured to maintain an off state during the specified idle range. The DK GEN subcomponent 420 may be configured to receive input data clock port signals (DK0~DK1 and DK#0~DK#1), e.g. through its own input buffers, and to generate device write input data clock according to signal DBON in active mode during normal range, and may too maintain an off state during the specified idle range.

FIG. 5 is a diagram showing illustrative operational timing features such as may be associated with the circuitry of FIG. 4, consistent with one or more aspects related to the innovations herein. The signals (IBON0, 1, and 2), via configuration(s) of control system 490, may be held at high level states more selectively as a function of such configurations according to tCK range even though the power up initialization procedures are completed, while signal DBON is only enabled active for write command(s) via the high level state. Accordingly, such memory circuits may consume lower necessary standby power consistent with Table 2.

Turning back to first circuitry of clock frequency detector 431B, a detailed schematic diagram depicting one illustrative implementation of such circuitry is shown in FIG. 6. Additionally, FIG. 7A and FIG. 7B are illustrative timing diagrams showing exemplary operation features thereof, including detecting enable operation and disable operation in the first clock frequency detector.

FIG. 6 is a block diagram showing an illustrative clock frequency detector circuitry, consistent with one or more aspects related to the innovations herein. The first clock frequency detector 600 of FIG. 6 may have an input internal clock signal generator subcomponent 690, which may include an active current sink 682, a current mirror sense 691, an output clock signal generator 692, and an output latch 693. At input, signal JCLK may be coupled to inverter 680 (inverter 601~602) of the input internal clock signal generator 690 to produce a 2-inverter delayed signal JKD2 based on signal JCLK. Signal JKD2 may then be processed to produce a 5-inverter delayed signal JKD7 via inverter chain delay 681 (inverter 603~607).

Here, then, a relevant timing period as between signal JKD2 and JKD7, expressed via t1 702 in FIGS. 7A and 7B, is a delay from rise of signal JKD2 to fall of signal JKD7. FIGS. 7A and 7B are diagrams showing illustrative operational timing features such as may be associated with the circuitry of FIG. 6, consistent with one or more aspects related to the innovations herein. During the timing period t1 702, active sink 682 circuitry can sink current io1 at the rising edge of input signal JCLK, e.g. sinking current io1 through the series connected NMOS 682 (N628 gate tied to signal JKD2 and N629 gate tied to signal JKD7) to ground. An internal clock generator 683 coupled to signal JKD2 may produce complementary signals lab5 and lat5 for first D flip-flop 688A of the output latch 693. Sense component 691, such as the current mirror sense shown in FIG. 6, may be configured to convert current ir1 induced by signal IBP1 voltage to current ic1 via NMOS current mirror 684. Further, a current mirror sense component 691 may also be configured to convert current id to current io1 via PMOS current mirror 685. Here, for example, an NMOS component N622 and a PMOS component P626 may be configured as decoupling capacitors for signal IBP1 and signal cmir. The current mirror sense may include other circuitry such as an NMOS capacitor N627 coupled to the PMOS current mirror 685, to the active sink 682 of the input internal clock signal generator 690, and to inverter 634 of the output clock signal generator 692. Here, then, inverter 634 may be a load capacitor to measure voltage level of signal Cout in response to sink current is 1 density, as governed/controlled by signal JCLK frequency range. For example, as current is1 is greater than current io1 at high frequency, the signal Cout voltage may be held at near ground voltage level, wherein the inverter 634 detects signal Cout voltage as the low level (enabling state). On the other hand, as current is1 is less than current io1 at low frequency, signal Cout voltage may be held at near internal voltage level, wherein the inverter 634 detects signal Cout voltage as the high level (disabling state).

Next, the output clock signal generator 692 may be configured both to receive the signal Cout via coupling to inverter 634 and to output signal cout7 after passing through an inverter chain delay 686 (inverter 634~637). Further, an inverter driver 687 may be included, coupled to the inverter chain delay 686, to produce digitized output signals (signal dat8, rst8, and rst9), e.g., for the initial set of D-flip flop(s) 688A that follow located within a subsequent output latch component 693.

In some implementations, an output latch component 693 may be included and may comprise a set of serially connected D flip-flops 688A and 688B. Further, such flip-flops 688A, 688B may be configured to operate essentially as a two-stage latch. Here, for example, the first D flip-flop (D: signal dat8, Q: signal dat12, S: rst8, R: signal rst9, and CLK: signal lab5) may be configured to receive input signal dat8 and produce output signal dat12. The second D flip-flop (D: signal dat12, Q: signal FDET1, S: shifted signal dat12, R: fix to enable, and CLK: signal JCLK) may be configured to receive input signal dat12 and produce output signal FDET1. As a result of the first D flip-flop 688A, the signal output (signal Gout) from the sense component 691 may achieve a latched state eventually. As a result of the second D flip-flop 688B, output latch 693/frequency detector circuitry may be synchronized with the external clock falling edge whenever updating the signal dat12, in order to avoid illegal command decoding (e.g. with reference to command decoder 412) associated with the control-peripheral 410A. Here, avoiding such decoding may involve input/control via signal IBON1 associated with this first clock frequency detector output signal FDET1. For example, if the signal FDET1 updating occurs at a clock nth rising edge, while at the same time the command decoder 412 is receiving an invalid combination due to FDET1 enable-transition at the nth clock rising edge and tries to latch the nth invalid combination status, system 490 may have a problem; however, at the nth clock falling edge, it may be configured not to receive any command, but instead to receive a next command via at least at the nth-E1 rising edge.

An illustrative implementation of second circuitry of clock frequency detector 431B is set forth in the schematic diagram 800 shown in FIG. 8. Further, the associated operation timing diagrams, here, may be consonant with the operation timing diagrams shown in FIG. 7A and FIG. 7B. Here, for example, an exemplary second clock frequency detector 800 may include an input internal clock signal generator component 890 having an active current sink 882, a current mirror sense component 891, an output clock signal generator component 892, and an output latch component 893. Input signal JCLK coupled to inverter 880 (inverter 801~802) of the input internal clock signal generator 890 produces a two inverter delayed signal KKD2 based on signal JCLK. Signal KKD2 may then be fed through an inverter chain delay 881 (inverter 803~807) to produce a five inverter delayed signal KKD7, such that the duration t2 between signal KKD2 and KKD7 is a delay from signal KKD2 rise to signal KKD7 fall. Over timespan t2, the active sink 882 can sink current io2 at the rising edge of signal JCLK by means of the series connected NMOS 882 (N828 gate tied to signal KKD2 and N629 gate tied to signal KKD7) to ground. Further, internal clock generator circuitry 883 coupled to signal KKD2 generates complementary signal kab5 and kat5 for first D flip-flop for the output latch 893.

Turning to a next illustrative subcomponent of the second clock frequency detector 800, current mirror sense component 891 may be configured to convert current ir2 induced by signal IBP1 voltage to current ic2 via NMOS current mirror 884 and also to convert current ic2 to current io2 via PMOS current mirror 885. Here, for example, NMOS N822 and PMOS P826 may be decoupling capacitors for the IBP1 signal and the kmir signal. The NMOS N827 capacitor may be coupled to the PMOS current mirror 885, the active sink 882 and inverter 834, wherein the inverter 834 is a load capacitor which may be adapted to measure voltage level of signal kout in response to sink current is2 density controlled via the signal JCLK frequency range. Here, for example, as current is2 is larger than current io2 at high frequency, signal cout voltage is maintained/held at near ground voltage level, wherein the inverter 834 detects signal kout voltage at the low level (enabling state). On the other hand, when current is2 is smaller than current io2 at low frequency, signal kout voltage is maintained at near the internal voltage level, which means the inverter 834 detects signal kout voltage at the high level (disabling state).

An illustrative output clock signal generator component 892 is also shown, which may be configured to receive the signal kout via coupling to first inverter 834 as part of an inverter chain delay circuit 886 (inverter 834~837), which outputs signal kout7. An inverter driver circuit 887 may also be included, coupled to the inverter chain delay circuit 886, and may be configured to produce digitized output signals (signal kat8, kst8, and kst9). Such digitized output signals may then be fed into the initial circuitry of the output latch component 893 that follows, such as into the D-flip flop(s) therein. Further, the output latch 893 may be configured to operate essentially as a one-stage latch. Here, for example, the circuitry may be configured with the first D flip-flop inputs/signals (D: signal kat8, Q: signal kat12, S: kst8, R: signal kst9, and CLK: signal kab5) to receive input signal kat8 and produce output signal FDET2. As such, the first D flip-flop 893 may be configured to achieve an eventual latch of the sense 891 data output (signal kout).

FIG. 9 is a block diagram showing an illustrative control-i/o buffer enable circuitry, consistent with one or more aspects related to the innovations herein. An illustrative implementation of control-i/o buffer enable circuit 431A is set forth in the schematic diagram 900 of FIG. 9. Further, the timing diagrams shown in FIG. 10 depict exemplary aspects of how the control-i/o buffer enable circuit 431 may operate with a control set signal and frequency detector. Referring to FIG. 9, an exemplary control i/o buffer enable circuit 431A may include an internal vref power up circuit 910, an internal wfb decoder 920, an internal fdet decoder 930, ibon0 driver 940, ibon1 driver 950, and ibon2 driver 960. Here, for example, this schematic diagram 900 of FIG. 9 shows illustrative decoding logic after receiving signal PWRUP2, signal VREF, signal WFBIN, signal PUP1_VDD, signal FDET1, signal BSR_RST, and signal DKON in order to support memory device functional modes (pwrup up initialization, wafer-burn-in test, low-power mode like clock stop, active mode, and JTAG mode).

Turning to the component circuits, the internal vref power up circuit 910 may be configured to receive signal PWRUP2 and signal VREF, and to produce output signal PWR23. The first control set signal decoder 907 may be coupled to complementary signal PWR21 controlled by the inverter 901 as well as to signal VREF to generate signal PWR22 coupled to a latch 908. Further, then, the output signal PWR23 of the latch 908 may be connected to the internal wfb decoder 920. As is also shown in the operational timing diagram referencing various waveforms in FIG. 10, signal PWR23 is a combined signal of PWRUP2 with signal VREF. FIG. 10 is a diagram showing illustrative operational timing features such as may be associated with the circuitry of FIG. 9, consistent with one or more aspects related to the innovations herein. Referring to FIG. 10, the signal PWR25, given as a function of signal PWR23 and signal WFBIN, may generate disable-all IBON (IBON0, 1, and 2) states when the signal WFBIN is maintained high to reduce power consumption, such as only at a wafer burn-in mode; however, in a normal mode, PWR25 may be shifted from the signal PWR23 state. Also, signal PUP1_VDD is another power up signal enabled via detecting ramping up of an external power supply and may be configured for initializing signal PWR27 and FDET29. The signal IBON0, given as a function of signal PWR25 and signal PUP1_VDD, may be shifted from the signal PWR25 state to turn on (e.g. persistently) after a power up initialization procedure and to maintain a stable NOP state. The signal IBON1, given as a function of signal FDET27 and signal PUP1_VDD, may be shifted from the signal FDET1 state or inversed from the signal BSR_RST state to reduce power consumption at idle range or in JTAG function mode(s), too. The signal IBON2, given as a function of signal FDET27 and signal DKON, may be shifted from the signal FDET27 state or the signal DKON state (enabled only active in write command with the high level-state) to reduce power consumption in/at active operation mode(s).

Turning back to FIG. 9, the internal wfb decoder 920, which receives control signal WFBINB (inverted signal WFBIN), may be configured as a driver for signal PWR23. Once the input signal WFBIN (wafer burin-in enable signal) is enabled with the high level-state of signal WFBIN, the output signal PWR25 switches to the low level-state in order to turn off all device(s) except a desired memory cell section to be stressed. Otherwise, the WFBIN is set to the low level-state in normal mode. Also in FIG. 9, the internal fdet decoder circuit 930 may be controlled by signal FDET1 and BSR_RST, which serve as drivers for the signal PWR25. Here, then, once input signal FDET1 is disabled with the low level-state of signal FDET1, the output signal FDET27 turns to the low level-state in order to be turned off most device circuitry except the circuitry coupled to signal ibon0.

Next, when input signal BSR_RST is enabled with the low level-state of signal BSR_RST, the output signal FDET27 turns to the high level-state in order to turn on all i/o buffer(s) connected to pad sourced data. The ibon0 driver 940 may be configured to receive signal PWR25 through level shifting circuit 931, with inverter 932/933 generating signal IBON0, and the ibon1 driver 950 receiving signal FDET27 through level shifting circuit 941. Further, inverter 942/943 may generate signal IBON1, with the ibon2 driver 960 receiving signal FET27 wherein DKON generates signal IBON2. Table 3 is listing of exemplary interconnects coupling signal IBON0-2 and FDET1-2 to device circuitry.

TABLE 3

Detailed circuitry names controlled by signal IBONi/FDETi

| Group No. | Signal IBON0~2 | Signal FDET1~2 |
|---|---|---|
| 1 | IBON0 | N/A |
| 2 | IBON1 | FDET1 |
| 3 | IBON1 | FDET1 |
| 4 | N/A | FDET2 |
| 5 | N/A | FDET2 |
| 6 | IBON2 | FDET1 |

As set forth by way of illustration above, systems and methods of achieving an external clock frequency detector are disclosed. Further, the present disclosure includes implementations that generate and/or connect the CFD control-i/o buffer enable circuit to this memory circuit to reduce standby power consumption, e.g., in specified frequency mode(s) including clock stop mode, consistent with one or more features and/or benefits of the present innovations.

Additionally, the innovations herein may be achieved via implementations with differing or disparate components, i.e., beyond the specific circuits or circuitry set forth above. With regard to such other components (e.g., circuitry, computing/processing components, etc.) and/or computer-readable media associated with or embodying the present disclosure, for example, aspects of the innovations herein may be implemented consistent with numerous general or special purpose circuits, computing systems or configurations. Various exemplary circuits, computing systems, environments, and/or configurations that may be suitable for use with the innovations herein may include, but are not limited to, various power- or memory-related circuitry, such as that within personal computers, servers or server computing devices such as routing/connectivity components, hand-held or laptop devices, multiprocessor systems, microprocessor-based systems, set top boxes, smart phones, consumer electronic devices, network PCs, other existing computer platforms, distributed computing environments that include one or more of the above systems or devices, etc.

In some instances, aspects of the innovations herein may be achieved via logic and/or logic instructions including program modules, executed in association with the circuitry, for example. In general, program modules may include routines, programs, objects, components, data structures, etc. that perform particular tasks or implement particular control, delay or instructions. The inventions may also be practiced in the context of distributed circuit settings where circuitry is connected via communication buses, circuitry or links. In distributed settings, control/instructions may involve one or both local and remote computer storage media including memory storage devices.

Innovative circuitry and components herein may also include and/or utilize one or more type of computer readable media. Computer readable media can be any available media that is resident on, associable with, or can be accessed by such circuits and/or computing components. By way of example, and not limitation, such computer readable media may include or involve computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules or other data embodying the functionality herein. Further, communication media may include wired media such as a wired network or direct-wired connection, and wireless media such as acoustic, RF, infrared and other wireless media. Combinations of the any of the above are also included within the scope of computer readable media.

In the present description, the terms component, module, device, etc. may refer to any type of logical or functional circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive) to be read by a central processing unit to implement the functions of the innovations herein. Or, the modules can comprise programming instructions transmitted to a general purpose computer or to processing/graphics hardware. Also, the modules can be implemented as other hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, implementations and features consistent with the present inventions may be implemented through computer-hardware, software and/or firmware. For example, the systems and methods disclosed herein may be embodied in various forms including, for example, in association with memory of data processors, such as in computers that also include a database, digital electronic circuitry, firmware, software, or in combinations of them. Further, while some of the disclosed implementations describe components such as circuits, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various processes and operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc.

Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various circuits, logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and other mechanisms that may be used to transfer such formatted data and/or instructions through wireless, optical, or wired signaling media or any combination thereof. Examples of transfers of such formatted data and/or instructions include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain implementations of the innovations herein have been specifically described herein, it will be apparent to those skilled in the art to which the inventions pertains that variations and modifications of the various implementations shown and described herein may be made without departing from the spirit and scope of the disclosure. Accordingly, it is intended that the inventions be limited only to the extent required by the appended claims and the applicable rules of law.

What is claimed is:

1. A method of operating a clock frequency detected control input and output buffer enable circuit in a semiconductor device, the method comprising the steps of:
    in a power up operation mode:
    performing a first initialization of the semiconductor device using a first power up signal to initialize an internal power supply; and
    performing, after ramp up of the internal power supply and in response to a vref signal, a second initialization of the semiconductor device using a second power up signal to initialize internal peripheral components, the first power up signal voltage is equal to the second power up signal voltage, such that the internal power supply is not used.

2. The method of claim 1, wherein a vref pad signal is an external input reference voltage or its voltage level doesn't affect the second initialization step.

3. A method of operating a clock frequency detected control input and output buffer enable circuit in a semiconductor device, the method comprising the steps of:
    in a power up operation mode:
    performing a first initialization of the semiconductor device using a first power up signal to initialize an internal power supply; and
    performing, after ramp up of the internal power supply and in response to a vref signal, a second initialization of the semiconductor device using a second power up signal to initialize internal peripheral components
    wherein the step of performing a first initialization of the semiconductor device internal-dc circuit includes switching a first power up signal to a first power up disable state about 1.0 v from a first enable state in response to ramping up a first external power supply without affecting a state of a first output set signal levels; and
    wherein the step of performing a second initialization the semiconductor device internal-peripheral circuit includes switching a second power up signal coupled to an internal vref power up circuit to a second power up disable state by ramping up vref pad voltage level around MOS threshold voltage level from a second enable state without affected to states of a first output set signal levels.

4. The method of claim 3, wherein a vref pad signal is an external input reference voltage or its voltage level doesn't affect the second initialization step.

* * * * *